(12) United States Patent
Zhang

(10) Patent No.: US 10,153,377 B2
(45) Date of Patent: Dec. 11, 2018

(54) DUAL-GATE THIN FILM TRANSISTOR AND MANUFACTURING METHOD THEREOF AND ARRAY SUBSTRATE

(71) Applicant: Shenzhen China Star Optoelectronics Technology Co., Ltd., Shenzhen, Guangdong (CN)

(72) Inventor: Hejing Zhang, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/907,666

(22) PCT Filed: Dec. 25, 2015

(86) PCT No.: PCT/CN2015/098965
§ 371 (c)(1),
(2) Date: Jan. 26, 2016

(87) PCT Pub. No.: WO2017/067062
PCT Pub. Date: Apr. 27, 2017

(65) Prior Publication Data
US 2017/0236947 A1    Aug. 17, 2017

(30) Foreign Application Priority Data

Oct. 22, 2015 (CN) .......................... 2015 1 0695462

(51) Int. Cl.
*H01L 29/786* (2006.01)
*H01L 29/66* (2006.01)
(Continued)

(52) U.S. Cl.
CPC .... *H01L 29/78645* (2013.01); *H01L 21/0217* (2013.01); *H01L 21/02164* (2013.01);
(Continued)

(58) Field of Classification Search
CPC ......... H01L 29/78645; H01L 29/41733; H01L 29/42384; H01L 21/02164
See application file for complete search history.

(56) References Cited

U.S. PATENT DOCUMENTS

2011/0147756 A1* 6/2011 Moriguchi ........ H01L 29/78609
257/60
2014/0061653 A1    3/2014 Kim et al.
(Continued)

FOREIGN PATENT DOCUMENTS

KR    1020120070709 A    7/2012
KR    1020140137729 A    12/2014

*Primary Examiner* — Mohsen Ahmadi
*Assistant Examiner* — Gustavo Ramallo
(74) *Attorney, Agent, or Firm* — Andrew C. Cheng

(57) ABSTRACT

The present disclosure proposes a dual-gate thin film transistor and manufacturing method thereof and an array substrate. A manufacturing method includes: forming a first gate electrode, a gate insulating layer, a semiconductor layer, and an etch stop layer on a first substrate sequentially; forming a drain electrode, an independent electrode, and a source electrode on the exposed semiconductor layer; forming an insulating passivation layer on surfaces of the exposed etch stop layer, the drain electrode, the source electrode, and the independent electrode; and forming a second gate electrode on the insulating passivation layer in an area corresponding to the first gate electrode. The present disclosure can resolve the leakage current problem caused by the effective channel length between the source electrode and the drain electrode to improve the electrical properties of the dual-gate thin film transistor and improve its stability. The present disclosure can simplifies processes and reduce cost.

8 Claims, 2 Drawing Sheets

(51) Int. Cl.
*H01L 21/02* (2006.01)
*H01L 29/417* (2006.01)
*H01L 29/423* (2006.01)

(52) U.S. Cl.
CPC .. *H01L 21/02266* (2013.01); *H01L 29/41733* (2013.01); *H01L 29/42384* (2013.01); *H01L 29/66742* (2013.01); *H01L 29/78648* (2013.01); *H01L 29/78696* (2013.01)

(56) References Cited

U.S. PATENT DOCUMENTS

| | | |
|---|---|---|
| 2014/0084282 A1 | 3/2014 | Cao et al. |
| 2014/0118232 A1 | 5/2014 | Kim |
| 2015/0228677 A1* | 8/2015 | Miyairi ............... H01L 27/1225 438/104 |
| 2017/0141140 A1 | 5/2017 | Li |
| 2017/0148817 A1 | 5/2017 | Shi et al. |

* cited by examiner

US 10,153,377 B2

DUAL-GATE THIN FILM TRANSISTOR AND MANUFACTURING METHOD THEREOF AND ARRAY SUBSTRATE

BACKGROUND OF THE INVENTION

1. Field of the Invention

The present invention relates to a display area, more particularly, to a dual-gate thin film transistor and a manufacturing method thereof and an array substrate.

2. Description of the Related Art

With the development of flat panel displays, which are represented by liquid crystal displays (LCDs) and organic light-emitting diode (OLED) displays, toward large size and high resolution, thin film transistors (TFTs) serve as core components of the flat panel display industry and have attracted extensive attention.

Because dual-gate thin film transistors have incomparable advantages as compared with single-gate thin film transistors, they have become very popular. For example, it is easier for a dual-gate thin film transistor to control the threshold voltage Vth and it also has a more stable luminance, and so on.

However, due to the differences caused by the structural design or process of dual-gate transistors, the dual-gate thin film transistors tend to generate a higher leakage current (i.e. turn-off current $I_{off}$ is higher), thus affecting basic electrical properties and applications of the dual-gate thin film transistors.

SUMMARY OF THE INVENTION

It is an objective of the present invention to provide a dual-gate thin film transistor and a manufacturing method thereof and an array substrate, which can effectively reduce the leakage current caused by the effective channel length between the source electrode and the drain electrode so as to improve the electrical properties of the dual-gate thin film transistor.

The technical solution according the present invention is to provide a manufacturing method of a dual-gate thin film transistor. The method comprises: forming a first gate electrode, a gate insulating layer, a semiconductor layer, and an etch stop layer on a first substrate sequentially, three opening areas being disposed in the etch stop layer in an area where the etch stop layer covers the semiconductor layer so that the semiconductor layer corresponding to the three opening areas is exposed; forming a drain electrode, an independent electrode, and a source electrode on the exposed semiconductor layer, a first channel being formed between the drain electrode and the independent electrode and a second channel being formed between the independent electrode and the source electrode so that the etch stop layer corresponding to the first channel and the second channel is exposed; forming an insulating passivation layer on surfaces of the exposed etch stop layer, the drain electrode, the source electrode, and the independent electrode; and forming a second gate electrode on the insulating passivation layer in an area corresponding to the first gate electrode.

In one aspect of the present invention, the second gate electrode at least covers the first channel and the second channel.

In another aspect of the present invention, the second gate electrode is etched to remove a first area, a cross-sectional area of the semiconductor layer corresponding to the etched first area is smaller than or equal to a cross-sectional area of the independent electrode.

In still another aspect of the present invention, the second gate electrode is etched to remove a first area, a cross-sectional area of the semiconductor layer corresponding to the etched first area is smaller than or equal to a cross-sectional area of the independent electrode.

In yet another aspect of the present invention, the step of forming the insulating passivation layer on the surfaces of the exposed etch stop layer, the drain electrode, the source electrode, and the independent electrode is:

Forming the insulating passivation layer on the surfaces of the etch stop layer, the drain electrode, the source electrode, and the independent electrode by sputtering silicon oxide SiOx or/and silicon nitride SiNx.

Another technical solution according the present invention is to provide a dual-gate thin film transistor. The dual-gate thin film transistor comprises: a first substrate, and a first metal layer, a gate insulating layer, a semiconductor layer, an etch stop layer, a second metal layer, an insulating passivation layer, and a third metal layer sequentially disposed on the first substrate. The first metal layer is a first gate electrode. The third metal layer is a second gate electrode, and the first gate electrode connects the second gate electrode. Three opening areas are disposed in the etch stop layer in an area where the etch stop layer covers the semiconductor layer so that the semiconductor layer corresponding to the three opening areas is not covered by the etch stop layer. The second metal layer is divided into a drain electrode, an independent electrode, and a source electrode corresponding to the semiconductor layer not covered by the etch stop layer. A first channel is formed between the drain electrode and the independent electrode and a second channel is formed between the independent electrode and the source electrode so that the etch stop layer corresponding to the first channel and the second channel is exposed.

In one aspect of the present invention, the second gate electrode at least covers the first channel and the second channel.

In another aspect of the present invention, the second gate electrode is etched to remove a first area, a cross-sectional area of the semiconductor layer corresponding to the etched first area is smaller than or equal to a cross-sectional area of the independent electrode.

In still another aspect of the present invention, the second gate electrode is etched to remove a first area, a cross-sectional area of the semiconductor layer corresponding to the etched first area is smaller than or equal to a cross-sectional area of the independent electrode.

In yet another aspect of the present invention, the insulating passivation layer comprises silicon oxide SiOx or/and silicon nitride SiNx.

In one aspect of the present invention, an effective channel length between the source electrode and the drain electrode is a sum of a length corresponding to the first channel and a length corresponding to the second channel when the dual-gate thin film transistor is turned on; the effective channel length between the source electrode and the drain electrode is a sum of the length corresponding to the first channel, the length corresponding to the second channel, and a distance between the first channel and the second channel when the dual-gate thin film transistor is turned off.

Still another technical solution according the present invention is to provide an array substrate. The array substrate comprises any of the dual-gate thin film transistors.

Different from the prior art, an independent electrode is added between the source electrode and the drain electrode so that the effective channel length between the source electrode and the drain electrode when the dual-gate thin film transistor is turned on is smaller than that when the dual-gate thin film transistor is turned off. The above method makes the ratio of the turned-on (ON state) current to the turned-off (OFF state) current of the dual-gate thin film transistor become higher, thus resolving the leakage current problem caused by the effective channel length between the source electrode and the drain electrode according to the prior art to improve the electrical properties of the dual-gate thin film transistor and improve its stability.

DESCRIPTION OF THE EMBODIMENTS

For the purpose of description rather than limitation, the following provides such specific details as a specific system structure, interface, and technology for a thorough understanding of the application. However, it is understandable by persons skilled in the art that the application can also be implemented in other embodiments not providing such specific details. In other cases, details of a well-known apparatus, circuit and method are omitted to avoid hindering the description of the application by unnecessary details.

Figure 1:
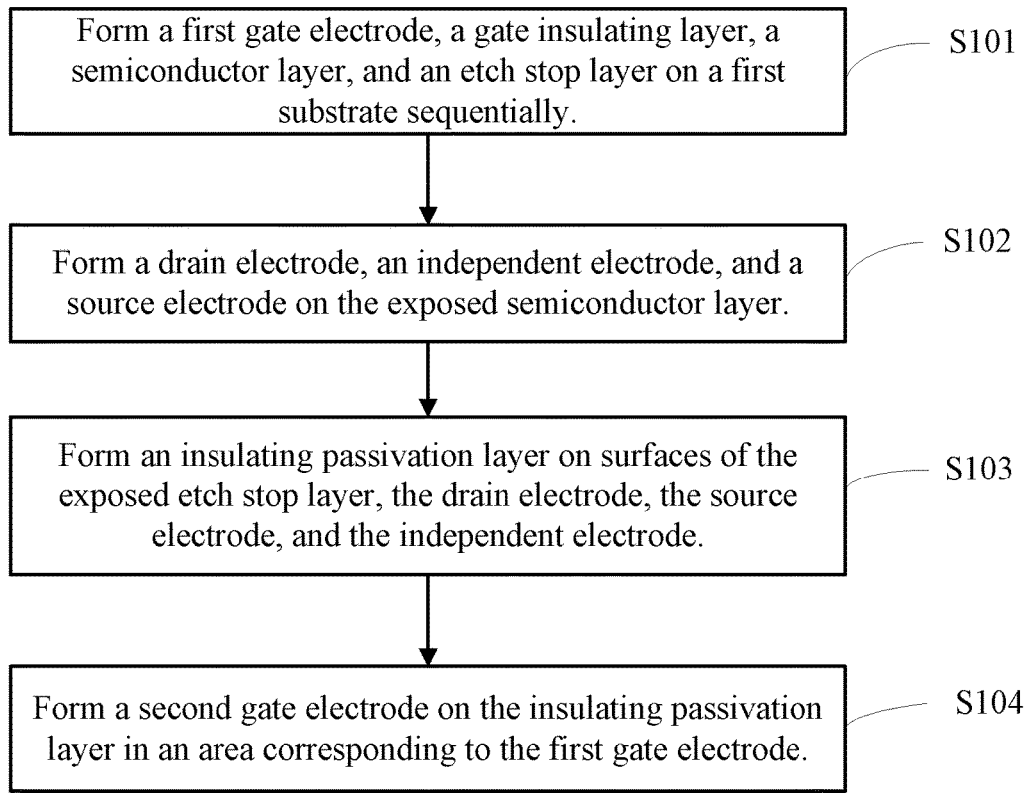
FIG. 1 is a schematic diagram of a flow of a manufacturing method of a dual-gate thin film transistor according to one embodiment of the present invention.

Refer to FIG. 1, FIG. 1 is a schematic diagram of a flow of a manufacturing method of a dual-gate thin film transistor according to one embodiment of the present invention. The manufacturing method according to the present embodiment comprises the steps of:

S101: form a first gate electrode, a gate insulating layer, a semiconductor layer, and an etch stop layer on a first substrate sequentially.

In greater detail, a metal film is first formed on the first substrate through deposition. The metal film is exposed by using a first mask to etch the metal film as the first gate electrode.

The first substrate comprises a glass substrate or a quartz substrate. In other embodiments, the first substrate may further be some other type of substrate, and the present invention is not limited in this regard.

The metal film comprises at least one of aluminum (Al), molybdenum (Mo), copper (Cu) and silver (Ag). In other embodiments, the metal film may further be some other type of metal, and the present invention is not limited in this regard.

A deposition process generally refers to that a foreign substance is deposited on the surface of the substrate to form a film, which is also known as vapor deposition. In the present embodiment, the metal film is formed on a surface of the first substrate by using a metallic substance. In other embodiments, some other deposition method can be used to realize the metal film, and the present invention is not limited in this regard.

An etching process generally refers to that portions of the film not covered by the etchant resist is removed to form exactly the same pattern as the pattern of the etchant resist in the film. The etching process generally comprises dry etching or wet etching. However, the present embodiment is not limited in this regard, as long as the first gate electrode can be etched in the metal film.

After the first gate electrode is formed, the gate insulating layer is deposited on a surface of the first gate electrode.

The gate insulating layer comprises at least one of silicon nitride (SiNx) and amorphous silicon oxide (SiOx). In other embodiments, the gate insulating layer may be some other insulating substance, and the present invention is not limited in this regard.

After the gate insulating layer is formed, the semiconductor layer (active layer) is deposited on a surface of the gate insulating layer corresponding to an area of the first gate electrode. The semiconductor layer does not completely cover the gate insulating layer. A cross-sectional area of the semiconductor layer is larger than or equal to that of the first gate electrode.

After the semiconductor layer is formed, the etch stop layer is deposited on surfaces of the semiconductor layer and the exposed gate insulating layer. Three opening areas are disposed in the etch stop layer in an area where the etch stop layer covers the semiconductor layer so that the semiconductor layer corresponding to the three opening areas is exposed. Sizes of the three opening areas are not limited and may be formed depending on practical needs.

A first opening area, a second opening area, and a third opening area are respectively used for depositing a drain electrode, an independent electrode, and a source electrode.

S102: form the drain electrode, the independent electrode, and the source electrode on the exposed semiconductor layer.

After the first gate electrode, the gate insulating layer, the semiconductor layer, and the etch stop layer are sequentially formed on the first substrate, the drain electrode, the independent electrode, and the source electrode are formed on the exposed semiconductor layer. That is, the drain electrode, the independent electrode, and the source electrode are respectively formed in the three opening areas. The drain electrode, the independent electrode, and the source electrode may partially cover the etch stop layer.

A first channel is formed between the drain electrode and the independent electrode and a second channel is formed between the independent electrode and the source electrode in the semiconductor layer, so that the etch stop layer corresponding to the first channel and the second channel is exposed.

The method for forming the drain electrode, the independent electrode, and the source electrode may be: forming a metal film on the exposed semiconductor layer and the etch stop layer through deposition. The metal film is exposed by using a photo mask to etch the metal film as the drain electrode, the independent electrode, and the source electrode.

The independent electrode is used for decreasing an effective channel length between the source electrode and the drain electrode when the dual-gate thin film transistor is turned on. That is, when the dual-gate thin film transistor is turned on, the effective channel length between the source electrode and the drain electrode is a sum of a first channel length and a second channel length. When the dual-gate thin film transistor is turned off, the effective channel length between the source electrode and the drain electrode is a sum of the first channel length, the second channel length, and a distance between the first channel and the second channel.

Since the source electrode, the independent electrode, and the drain electrode are simultaneously etched, there is no need to increase a number of the photo masks, thus simplifying the manufacturing process and saving the cost.

S103: form an insulating passivation layer on surfaces of the exposed etch stop layer, the drain electrode, the independent electrode, and the source electrode.

After forming the drain electrode, the independent electrode, and the source electrode, the insulating passivation layer is formed on the surfaces of the exposed etch stop layer, the drain electrode, the source electrode, and the independent electrode.

More specifically, the insulating passivation layer is formed on the surfaces of the etch stop layer, the drain electrode, the source electrode, and the independent electrode by sputtering silicon oxide SiOx or/and silicon nitride SiNx.

S104: form a second gate electrode on the insulating passivation layer in an area corresponding to the first gate electrode.

After forming the insulating passivation layer, the second gate electrode is formed on the insulating passivation layer in the area corresponding to the first gate electrode. The first gate electrode is connected to the second gate electrode through via holes.

In greater detail, a metal film is first formed on the insulating passivation layer through deposition. The metal film is exposed by using a photo mask to etch the metal film as the second gate electrode.

The second gate electrode covers the first channel and the second channel. That is, the second gate electrode covers the insulating passivation layer in an area corresponding to the semiconductor layer, at least covers the first channel formed between the source electrode and the independent electrode and the second channel formed between the independent electrode and the drain electrode.

The second gate electrode is etched to remove a first area. A cross-sectional area of the semiconductor layer corresponding to the etched first area is smaller than or equal to a cross-sectional area of the semiconductor layer covered by the independent electrode, so that the second gate electrode can completely cover the first channel and the second channel.

More specifically: a metal film is first formed on the insulating passivation layer through deposition. The metal film is exposed by using a photo mask to etch the metal film as the second gate electrode. The first area of the second gate electrode is etched to divide the second gate electrode into two parts. The two parts of the second gate electrode divided by the first area are at least able to cover the first channel and the second channel, respectively.

The etched first area allows the second gate electrode not to overlap the independent electrode so as to reduce a parasitic capacitance formed between the second gate electrode and the independent electrode effectively.

Different from the prior art, an independent electrode is added between the source electrode and the drain electrode so that the effective channel length between the source electrode and the drain electrode when the dual-gate thin film transistor is turned on is smaller than that when the dual-gate thin film transistor is turned off. The above method makes the ratio of the turned-on (ON state) current to the turned-off (OFF state) current of the dual-gate thin film transistor become higher, thus resolving the leakage current problem caused by the effective channel length between the source electrode and the drain electrode according to the prior art to improve the electrical properties of the dual-gate thin film transistor and improve its stability.

Figure 2:
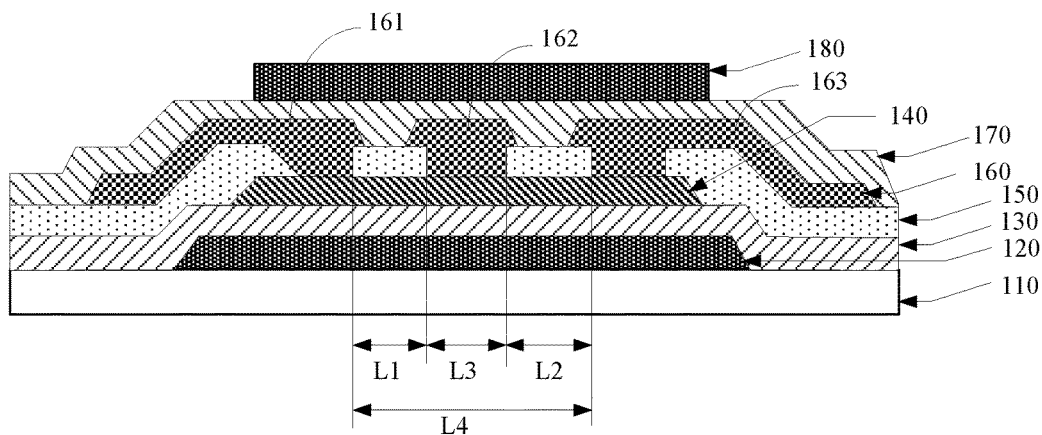
FIG. 2 is a schematic diagram of a cross-sectional structure of a dual-gate thin film transistor according to one embodiment of the present invention.

Refer to FIG. 2, FIG. 2 is a schematic diagram of a cross-sectional structure of a dual-gate thin film transistor according to one embodiment of the present invention.

The dual-gate thin film transistor according to the present embodiment comprises: a first substrate 110 and a first metal layer 120, a gate insulating layer 130, a semiconductor layer 140, an etch stop layer 150, a second metal layer 160, an insulating passivation layer 170, and a third metal layer 180 sequentially disposed on the first substrate 110. The first metal layer 120 is the first gate electrode. The third metal layer 180 is the second gate electrode, and the first gate electrode is connected to the second gate electrode through via holes inside the structure. The second metal layer 160 comprises a drain electrode 161, an independent electrode 162, and a source electrode 163. Of course, in other embodiments, 161 may be defined as the source electrode and 163 may be defined as the drain electrode.

As shown in FIG. 2, the first gate electrode 120 partially covers the first substrate 110. The first substrate 110 may be but is not limited to a glass substrate or a quartz substrate.

The gate insulating layer 130 completely covers the first gate electrode 120 and the first substrate 110. The semiconductor layer 140 is disposed in an area where the gate insulating layer 130 overlaps the first gate electrode 120. An area where the semiconductor layer 140 overlaps the gate insulating layer 130 is larger than or equal to the area where the gate insulating layer 130 overlaps the first gate electrode 120.

The etch stop layer 150 covers the gate insulating layer 130 and the semiconductor layer 140, and the three opening areas are disposed in the etch stop layer 150 in the area where the etch stop layer 150 covers the semiconductor layer 140, so that the semiconductor layer 140 corresponding to the three opening areas is not covered by the etch stop layer 150. The three opening areas are covered by the second metal layer 160.

The second metal layer 160 corresponding to the semiconductor layer 140 not covered by the etch stop layer 150 is divided into the drain electrode 161, the independent electrode 162, and the source electrode 163. The first channel is formed between the drain electrode 161 and the independent electrode 162 and the second channel is formed between the independent electrode 162 and the source electrode 163, so that the etch stop layer corresponding to the first channel and the second channel is exposed.

The second metal layer 160 forms the drain electrode 161, the independent electrode 162, and the source electrode 163 on the semiconductor layer 140 in the three opening areas. The first channel length formed between the drain electrode 161 and the independent electrode 162 is L1. The second channel length formed between the independent electrode 162 and the source electrode 163 and is L2. A length between the first channel and the second channel is L3 (a cross-sectional length corresponding to the independent electrode is L3).

The third metal layer (the second gate electrode) 180 is disposed in an area where the insulating passivation layer 170 overlaps the first metal layer (the first gate electrode) 120. A cross-sectional area of the third metal layer 180 may be smaller than a cross-sectional area of the first metal layer 120.

A material of the insulating passivation layer 170 may comprise silicon oxide SiOx or/and silicon nitride SiNx, and the present invention is not limited in this regard.

The third metal layer (the second gate electrode) 180 at least covers the first channel and the second channel. That is, the third metal layer (the second gate electrode) 180 is at least able to completely cover the first channel and the second channel.

When the dual-gate thin film transistor is turned on, a connection between the source electrode 163 and the drain electrode 161 is established through the semiconductor layer 140. The effective channel length between the source electrode 163 and the drain electrode 161 is equal to a sum of a length corresponding to the first channel and a length corresponding to the second channel. Since the independent electrode 162 is also conductive, the effective channel length between the source electrode 163 and the drain electrode 161 is the sum of L1 and L2 when the dual-gate thin film transistor is turned on.

When the dual-gate thin film transistor is turned off, the source electrode 163 is disconnected from the drain electrode 161. The effective channel length between the source electrode 163 and the drain electrode 161 is a sum of the length corresponding to the first channel, the length corresponding to the second channel, and the distance between the first channel and the second channel. That is, when the dual-gate thin film transistor is turned off, the effective channel length between the source electrode 163 and the drain electrode 161 is the sum of L1, L2, and L3.

Since the longer the channel length is, the smaller the current passing the dual-gate thin film transistor is. By adding an independent electrode between the source electrode and the drain electrode, a ratio of the turned-on (ON state) current to the turned-off (OFF state) current of the dual-gate thin film transistor becomes higher.

It is thus understood that the first channel length L1, the second channel length L2, and the distance between the first channel and the second channel can be disposed depending on practical needs, and the present invention is not limited in this regard.

Different from the prior art, an independent electrode is added between the source electrode and the drain electrode so that the effective channel length between the source electrode and the drain electrode when the dual-gate thin film transistor is turned on is smaller than that when the dual-gate thin film transistor is turned off. The above method makes the ratio of the turned-on (ON state) current to the turned-off (OFF state) current of the dual-gate thin film transistor become higher, thus resolving the leakage current problem caused by the effective channel length between the source electrode and the drain electrode according to the prior art to improve the electrical properties of the dual-gate thin film transistor and improve its stability.

Figure 3:
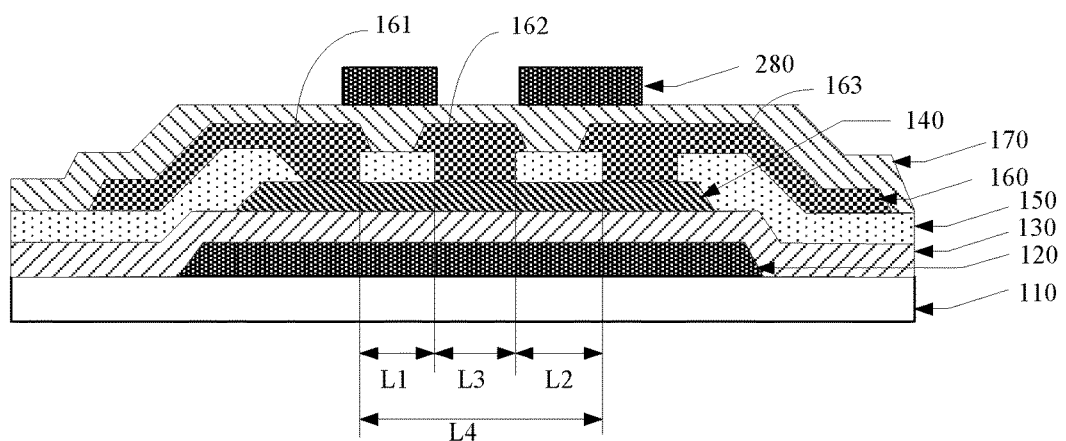
FIG. 3 is a schematic diagram of a cross-sectional structure of a dual-gate thin film transistor according to another embodiment of the present invention.

Refer to FIG. 3, FIG. 3 is a schematic diagram of a cross-sectional structure of a dual-gate thin film transistor according to another embodiment of the present invention. The difference between the present embodiment and the previous embodiment is a third metal layer (the second gate electrode) 280.

The third metal layer (the second gate electrode) 280 is etched to remove a first area according to the present embodiment. A cross-sectional area of the semiconductor layer 140 corresponding to the etched first area is smaller than or equal to a cross-sectional area of the semiconductor layer covered by the independent electrode 162, so that the second gate electrode 280 can completely cover the first channel and the second channel.

In greater detail, the third metal layer (the second gate electrode) 280 is etched to remove the first area. The first area divides the third metal layer (the second gate electrode) 280 into two parts. The two parts thus formed by dividing the second gate electrode 280 by using the first area are at least able to cover the first channel and the second channel, respectively.

The first area can allow the second gate electrode 280 not to overlap the independent electrode 162 or allow a smaller overlapped area between the second gate electrode 280 and the independent electrode 162, thus reducing a parasitic capacitance formed between the second gate electrode 280 and the independent electrode 162.

Different from the prior art, an independent electrode is added between the source electrode and the drain electrode so that the effective channel length between the source electrode and the drain electrode when the dual-gate thin film transistor is turned on is smaller than that when the dual-gate thin film transistor is turned off. The above method makes the ratio of the turned-on (ON state) current to the turned-off (OFF state) current of the dual-gate thin film transistor become higher, thus resolving the leakage current problem caused by the effective channel length between the source electrode and the drain electrode according to the prior art to improve the electrical properties of the dual-gate thin film transistor and improve its stability.

The disposition method of the second gate electrode can reduce the parasitic capacitance formed between the second gate electrode 280 and the independent electrode 162 to further improve the performance of the dual-gate thin film transistor.

The present invention further provides an array substrate (not shown in the figure). The array substrate comprises any of the above dual-gate thin film transistors.

The present invention further provides a liquid crystal display device (not shown in the figure). The liquid crystal display device comprises an upper substrate, a lower substrate, and a liquid crystal layer sandwiched between the upper substrate and the lower substrate. The lower substrate comprises any of the above dual-gate thin film transistors.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. A manufacturing method of a dual-gate thin film transistor comprising:
   forming a first gate electrode, a gate insulating layer, a semiconductor layer, and an etch stop layer on a first substrate sequentially, three opening areas being disposed in the etch stop layer in an area where the etch stop layer covers the semiconductor layer so that the semiconductor layer corresponding to the three opening areas is exposed;
   forming a drain electrode, an independent electrode, and a source electrode on the exposed semiconductor layer, a first channel being formed between the drain electrode and the independent electrode and a second channel being formed between the independent electrode and the source electrode so that the etch stop layer corresponding to the first channel and the second channel is exposed;
   forming an insulating passivation layer on surfaces of the exposed etch stop layer, the drain electrode, the source electrode, and the independent electrode; and forming a second gate electrode on the insulating passivation layer in an area corresponding to the first gate electrode,
wherein the second gate electrode is etched to remove a first area, a cross-sectional area of the semiconductor layer corresponding to the etched first area is smaller than or equal to a cross-sectional area of the independent electrode.

2. The method as claimed in claim 1, wherein the second gate electrode at least covers the first channel and the second channel.

3. The method as claimed in claim 1, wherein the step of forming the insulating passivation layer on the surfaces of the exposed etch stop layer, the drain electrode, the source electrode, and the independent electrode is:
forming the insulating passivation layer on the surfaces of the etch stop layer, the drain electrode, the source electrode, and the independent electrode by sputtering silicon oxide SiOx or/and silicon nitride SiNx.

4. A dual-gate thin film transistor comprising: a first substrate, and a first metal layer, a gate insulating layer, a semiconductor layer, an etch stop layer, a second metal layer, an insulating passivation layer, and a third metal layer sequentially disposed on the first substrate, the first metal layer being a first gate electrode, the third metal layer being a second gate electrode, and the first gate electrode connecting the second gate electrode;
wherein three opening areas are disposed in the etch stop layer in an area where the etch stop layer covers the semiconductor layer so that the semiconductor layer corresponding to the three opening areas is not covered by the etch stop layer;
the second metal layer is divided into a drain electrode, an independent electrode, and a source electrode corresponding to the semiconductor layer not covered by the etch stop layer, a first channel is formed between the drain electrode and the independent electrode and a second channel is formed between the independent electrode and the source electrode so that the etch stop layer corresponding to the first channel and the second channel is exposed,
wherein the second gate electrode is etched to remove a first area, a cross-sectional area of the semiconductor layer corresponding to the etched first area is smaller than or equal to a cross-sectional area of the independent electrode.

5. The dual-gate thin film transistor as claimed in claim 4, wherein the second gate electrode at least covers the first channel and the second channel.

6. The dual-gate thin film transistor as claimed in claim 4, wherein the insulating passivation layer comprises silicon oxide SiOx or/and silicon nitride SiNx.

7. The dual-gate thin film transistor as claimed in claim 4, wherein an effective channel length between the source electrode and the drain electrode is a sum of a length corresponding to the first channel and a length corresponding to the second channel when the dual-gate thin film transistor is turned on;
the effective channel length between the source electrode and the drain electrode is a sum of the length corresponding to the first channel, the length corresponding to the second channel, and a distance between the first channel and the second channel when the dual-gate thin film transistor is turned off.

8. An array substrate comprising the dual-gate thin film transistor as claimed in claim 4.

* * * * *